United States Patent
Mikhemar et al.

(10) Patent No.: US 8,452,253 B2
(45) Date of Patent: May 28, 2013

(54) COMPACT LOW-POWER RECEIVER INCLUDING TRANSIMPEDANCE AMPLIFIER, DIGITALLY CONTROLLED INTERFACE CIRCUIT, AND LOW PASS FILTER

(75) Inventors: Mohyee Mikhemar, Irvine, CA (US); Amir Hadji-Abdolhamid, Aliso Viejo, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 366 days.

(21) Appl. No.: 12/804,397

(22) Filed: Jul. 20, 2010

(65) Prior Publication Data

US 2012/0021712 A1  Jan. 26, 2012

(51) Int. Cl.
*H04B 1/10* (2006.01)

(52) U.S. Cl.
USPC .......................................... 455/307; 455/296

(58) Field of Classification Search
USPC .................. 455/307, 334, 341, 296
See application file for complete search history.

(56) References Cited

U.S. PATENT DOCUMENTS

| | | | |
|---|---|---|---|
| 6,606,359 B1 * | 8/2003 | Nag et al. | 375/348 |
| 8,260,227 B2 * | 9/2012 | Chiu | 455/130 |
| 8,311,155 B2 * | 11/2012 | Umeda et al. | 375/319 |

* cited by examiner

*Primary Examiner* — Blane J Jackson
(74) *Attorney, Agent, or Firm* — Farjami & Farjami LLP

(57) ABSTRACT

According to one embodiment, a compact low-power receiver comprises first and second analog circuits connected by a digitally controlled interface circuit. The first analog circuit has a first direct-current (DC) offset and a first common mode voltage at an output, and the second analog circuit has a second DC offset and a second common mode voltage at an input. The digitally controlled interface circuit connects the output to the input, and is configured to match the first and second DC offsets and to match the first and second common mode voltages. In one embodiment, the first analog circuit is a variable gain control transimpedance amplifier (TIA) implemented using a current mode buffer, the second analog circuit is a second-order adjustable low-pass filter, whereby a three-pole adjustable low-pass filter in the compact low-power receiver is effectively produced.

18 Claims, 6 Drawing Sheets

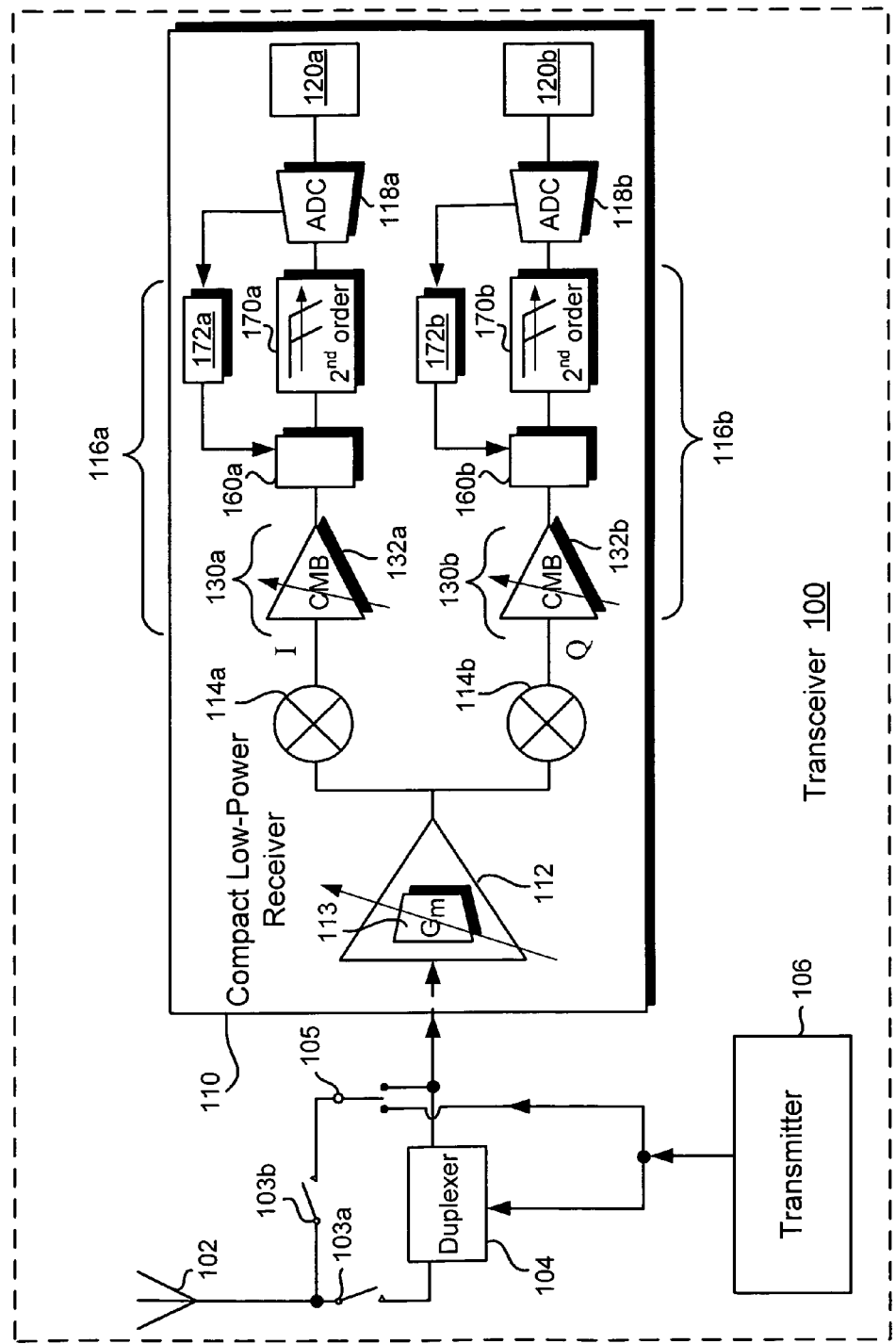

COMPACT LOW-POWER RECEIVER INCLUDING TRANSIMPEDANCE AMPLIFIER, DIGITALLY CONTROLLED INTERFACE CIRCUIT, AND LOW PASS FILTER

BACKGROUND OF THE INVENTION

1. Field of the Invention

The present invention is generally in the field of electronic circuits and systems. More specifically, the present invention is in the field of communications circuits and systems.

2. Background Art

As communications technologies move toward ever smaller device sizes and adopt ever lower power consumption constraints, identifying and harnessing operational synergies through the use of circuit combinations capable of sharing system functionality to becomes increasingly important. Consider, for example, a conventional radio frequency (RF) receiver implemented in a communications transceiver. A conventional receiver typically utilizes several stages to amplify and process what may often be a weak reception signal. For instance, a low noise amplifier (LNA) may be used to boost the reception signal prior to down-conversion from RF to baseband by a mixer stage in the receiver "front-end." The baseband signal is then normally filtered by a high-order low-pass filter (LPF), for example a $4^{th}$-order or $5^{th}$-order LPF, which provides substantial additional "back-end" gain in the conventional receiver design.

In such a conventional receiver, the gain control provided by the receiver as a whole may be primarily produced by the receiver back-end, with the high-order LPF contributing a significant portion of the overall gain. Due to the stringent requirements imposed on the high-order LPF in conventional receiver designs, however, the high-order LPF typically consumes much of the power and dominates most of the area required to implement the receiver. As communications technologies move toward ever smaller device sizes and adopt ever lower power consumption constraints, as represented by the 40 nm technology node, for example, the relative bulk and high power consumption of conventional receiver architectures have become ever more undesirable.

Thus, there is a need to overcome the drawbacks and deficiencies in the art by providing an interface circuit configured to facilitate generation of the synergies possible through shared functionality by a circuit combination, thereby enabling design of more efficient communications systems, such as a compact low-power receiver architecture suitable for implementation as part of a mobile device transceiver, for example.

SUMMARY OF THE INVENTION

The present invention is directed to a compact low-power receiver including transimpedance amplifier, digitally controlled interface circuit, and low pass filter, substantially as shown in and/or described in connection with at least one of the figures, and as set forth more completely in the claims.

BRIEF DESCRIPTION OF THE DRAWINGS

FIG. 1 is a block diagram of a compact low-power receiver according to one embodiment of the present invention.

DETAILED DESCRIPTION OF THE INVENTION

Figure 2A:
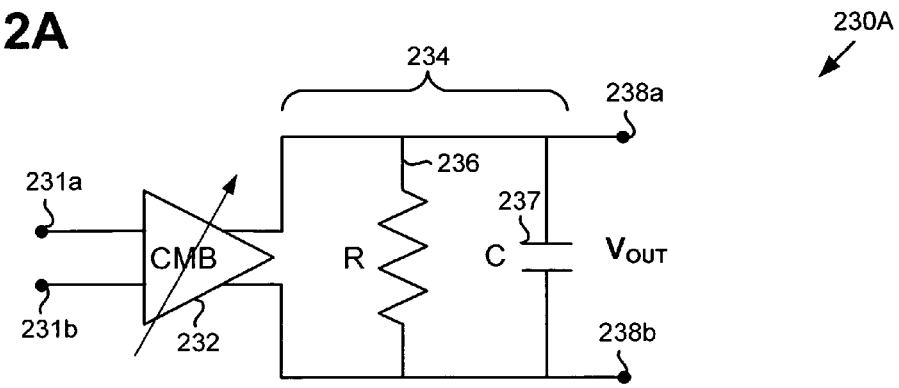
FIG. 2A is a block diagram of a current mode buffer based transimpedance amplifier (TIA) providing variable gain control according to one embodiment of the present invention.

The present invention is directed to a compact low-power receiver including transimpedance amplifier, digitally controlled interface circuit, and low pass filter. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

FIG. 1 is a block diagram of transceiver 100 comprising a receiver including a circuit combination having a shared functionality, which is implemented using a digitally controlled interface circuit, according to one embodiment of the present invention capable of overcoming the disadvantages associated with conventional designs. It is noted that the arrangement shown in FIG. 1 is for the purpose of providing an overview, and elements shown in that figure are conceptual representation of physical and electrical elements, and are thus not intended to show dimensions or relative sizes or scale.

Transceiver 100 comprises antenna 102, transceiver input/output routing switches 103a and 103b, duplexer 104, transmit/receive (T/R) switch 105, transmitter 106, and compact low-power receiver 110 including shared functionality circuit combinations 116a and 116b implemented using respective digitally controlled interface circuits 160a and 160b. As shown in FIG. 1, receiver 110 comprises low noise amplifier (LNA) 112 including adjustable transconductance amplifier 113 configured to provide digital gain control, mixers 114a and 114b working in conjunction with, respectively, in-phase (I) and quadrature-phase (Q) signals provided by a local oscillator (local oscillator not shown in FIG. 1), and variable gain control transimpedance amplifiers (TIAs) 130a and 130b including respective adjustable current mode buffers 132a and 132b. As further shown in FIG. 1, receiver 110 includes digitally controlled interface circuits 160a and 160b, second-order adjustable low-pass filters ($2^{nd}$-order adjustable LPFs) 170a and 170b, analog-to-digital converters (ADCs) 118a and 118b, interface control units 172a and 172b, and digital processors 120a and 120b to perform back-end processing of the respective I and Q signal components.

It is noted that although the I and Q receive signal paths are represented by single lines joining, for example, mixer 114a and variable gain control TIA 130a, variable gain control TIA 130a and digitally controlled interface circuit 160a, digitally controlled interface circuit 160a and $2^{nd}$-order adjustable LPF 170a, and $2^{nd}$-order adjustable LPF and ADC 118a, those signals may in fact be differential signals. Transceiver 100 may be utilized in a cellular telephone or other mobile device communicating at radio frequency (RF), for example, such as in a frequency range from approximately 0.8 GHz to approximately 2.2 GHz.

According to the embodiment of FIG. 1, shared functionality circuit combination 116a comprises variable gain control TIA 130a and $2^{nd}$-order adjustable LPF 170a, which may both be analog circuits, for example, and digitally controlled interface circuit 160a mediating their connection. As shown in FIG. 1, digitally controlled interface circuit 160a receives control data from ADC 118a, via interface control unit 172a. Similarly, shared functionality circuit combination 116b comprises variable gain control TIA 130b, 2nd-order adjustable LPF 170b, and digitally controlled interface circuit 160b receiving control data from ADC 118b via interface control unit 172b. It is noted that although interface control units 172a and 172b are shown as discrete circuit elements, in FIG. 1, in other embodiments interface control units 172a and 172b may be incorporated into respective digitally controlled interface circuits 160a and 160b, or into respective ADCs 118a and 118b, for example.

In marked contrast to conventional receiver implementations relying on substantial back-end gain, such as approximately 40 dB of gain produced by $4^{th}$-order or $5^{th}$-order LPFs, for example, the embodiment of the present invention shown in FIG. 1 produces a substantial majority of the overall receiver gain in the form of front-end gain. For example, the receiver front-end including LNA 112, mixers 114a and 114b, and variable gain control TIAs 130a and 130b can be implemented so as to contribute approximately 50 dB of the overall receiver gain, while 2nd-order adjustable LPFs 170a and 170b may be relied upon for a substantially smaller gain contribution, e.g., approximately 15 dB of gain.

The increase in front-end gain provided by compact low-power receiver 110 reduces the reliance on back-end gain in embodiments of the present invention, thereby relaxing the noise requirement on the LPFs used for filtering in the receiver back-end. Consequently, 2nd-order adjustable LPFs 170a and 170b can be implemented in place of the $4^{th}$-order or $5^{th}$-order LPFs required by conventional designs. Moreover, due in part to the operational synergy of shared functionality circuit combinations 116a and 116b facilitated by respective digitally controlled interface circuits 160a and 160b, that substitution can be made without sacrificing receiver performance, thereby reducing the area requirements and power requirements flowing from use of high-order LPF in conventional designs without imposition of a significant performance cost. As a result, the compact low-power receiver architecture disclosed herein is particularly well suited to meet fine dimensional and low power supply constraints as fabrication technologies transition to the 40 nm node and beyond. Thus, in one embodiment, compact low-power receiver 110 can be an integrated circuit (IC) fabricated on a single semiconductor die using a 40 nm process technology, for example.

Figure 2B:
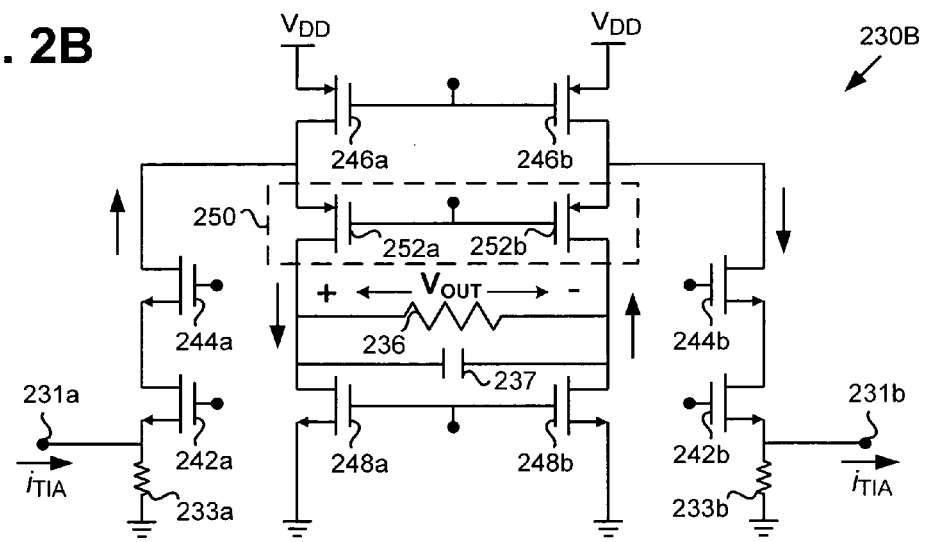
FIG. 2B illustrates a circuit corresponding to the variable gain control TIA of FIG. 2A.
Figure 2C:
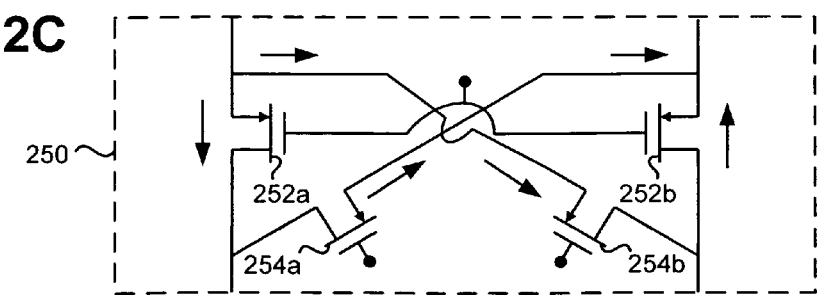
FIG. 2C illustrates exemplary cross-coupling of cascode devices included in the example circuit of FIG. 2B to provide gain control.
Figure 3:
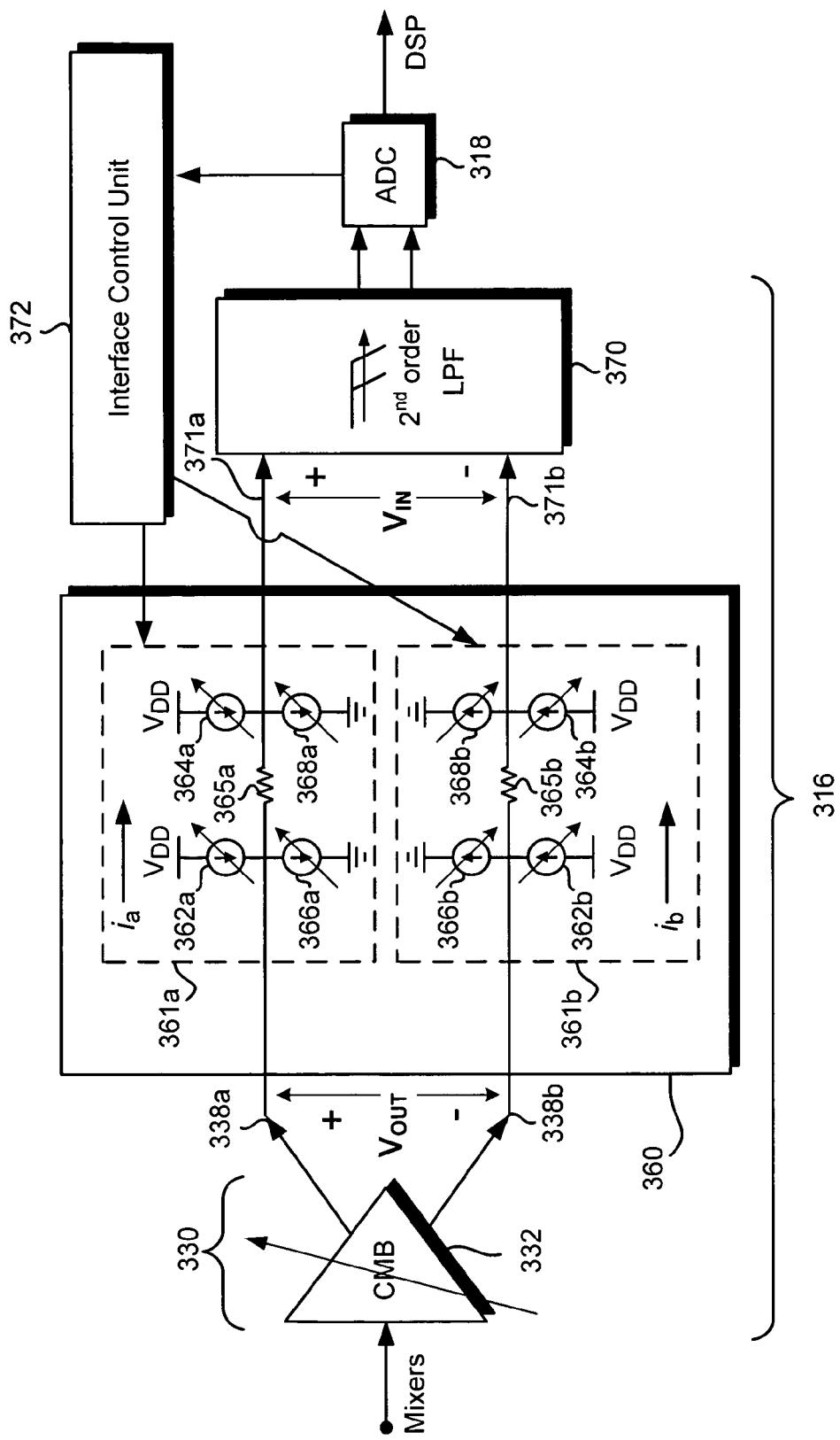
FIG. 3 is a block diagram of a digitally controlled interface circuit suitable for use in a compact low-power receiver, according to one embodiment of the present invention.
Figure 4A:
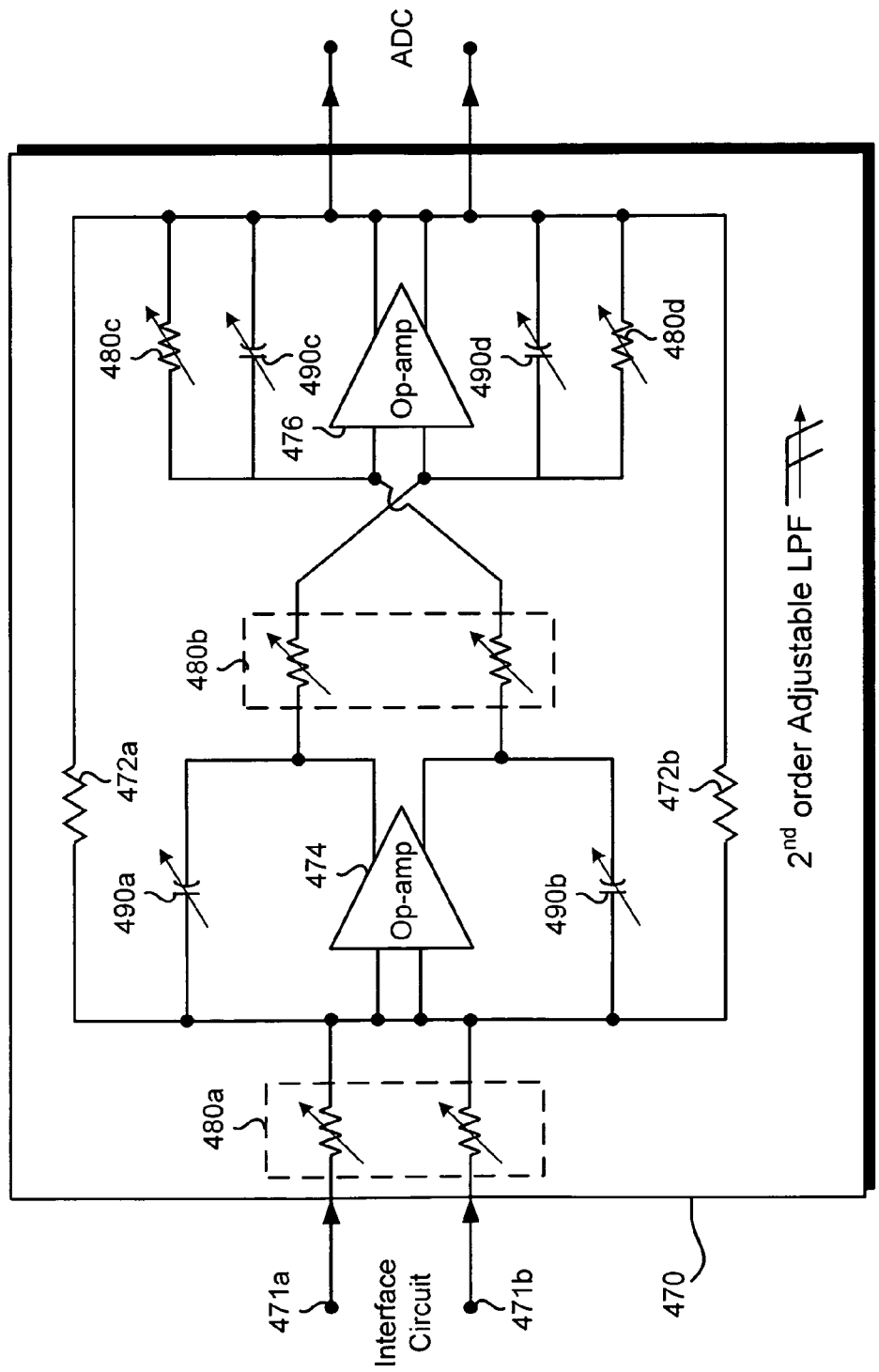
FIG. 4A is a block diagram of a $2^{nd}$-order adjustable low-pass filter (LPF) suitable for use in a compact low-power receiver, according to one embodiment of the present invention.
Figure 4B:
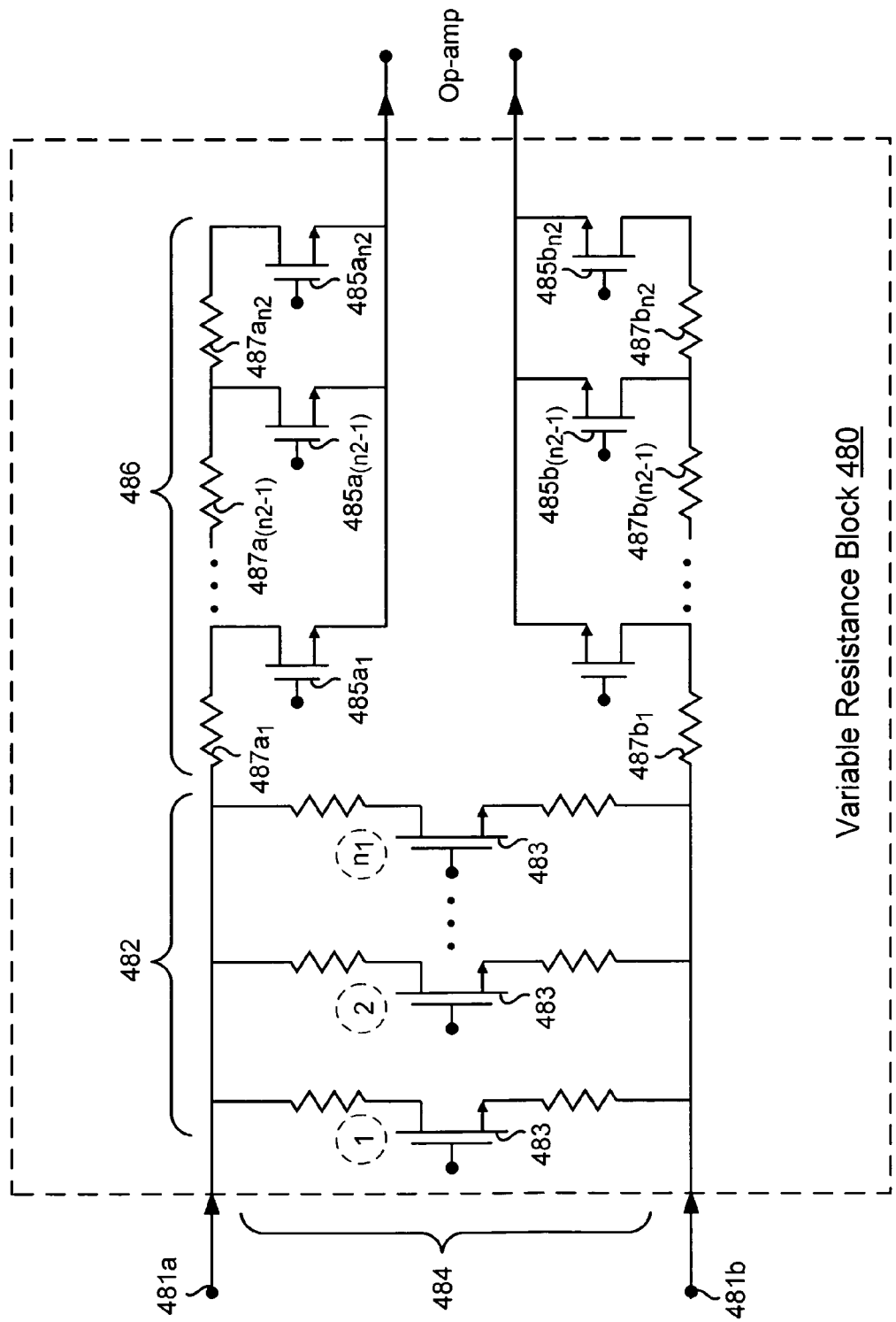
FIG. 4B is a block diagram of a variable resistance block implemented in the $2^{nd}$-order adjustable LPF of FIG. 4A.
Figure 4C:
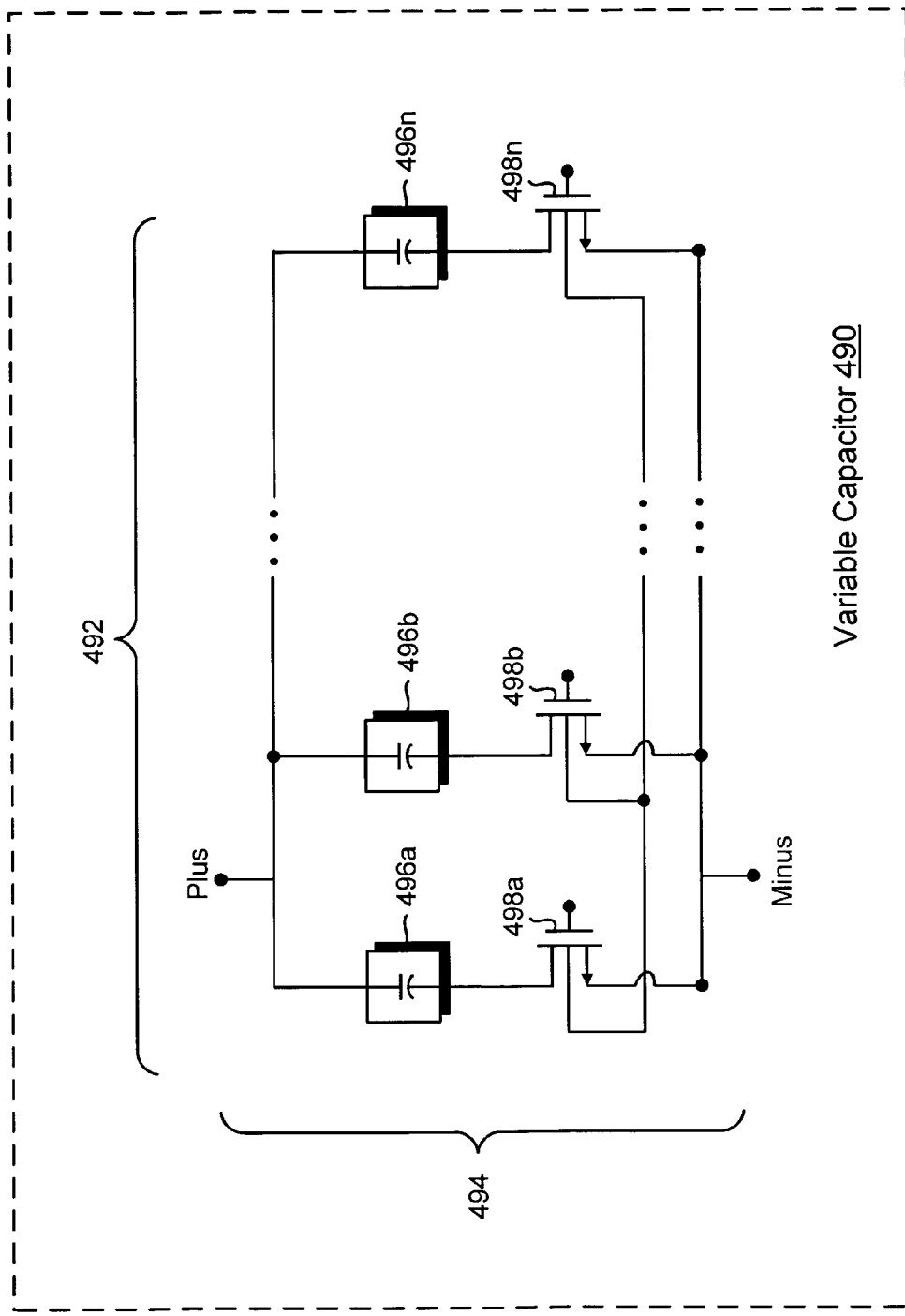
FIG. 4C is a block diagram of a variable capacitor implemented in the $2^{nd}$-order adjustable LPF of FIG. 4A.

The operation of shared functionality circuit combinations 116a and 116b, as well as the advantages accruing from implementation of respective digitally controlled interface circuits 160a and 160b, will now be further described by reference to FIGS. 2A, 2B, 2C, 3, 4A, 4B, and 4C. FIGS. 2A, 2B, and 2C show conceptual representations of a specific implementational example of a variable gain control TIA suitable for use in a shared functionality circuit combination, according to one embodiment of the present invention. FIG. 3, shows an exemplary implementation for a digitally controlled interface circuit for facilitating shared functionality by a circuit combination, while FIGS. 4A, 4B, and 4C depict conceptual representations of an 2nd-order adjustable LPF and its included variable resistive and variable capacitive components.

Referring to FIG. 2A, FIG. 2A shows variable gain control TIA 230A including adjustable current mode buffer 232, according to one embodiment of the present invention, corresponding to variable gain control TIAs 130a and 130b including respective adjustable current mode buffers 132a and 132b, in FIG. 1. Adjustable current mode buffer 232 may be configured for use with a low voltage power supply, for example, an approximately 1.2V power supply.

As shown by FIG. 2A, in addition to adjustable current mode buffer 232, variable gain control TIA 230A comprises RC network 234. RC network 234 includes output resistor 236 and output capacitor 237 coupled in parallel across differential outputs 238a and 238b. Output resistor 236 is configured to provide variable gain control by determining the maximum gain provided by variable gain control TIA 230A. Together, output resistor 236 and output capacitor 237 determine the pole frequency of variable gain control TIA 230A. As further shown by FIG. 2A, variable gain control TIA 230A receives differential currents at differential inputs 231a and 231b, and provides a voltage signal $V_{OUT}$ across differential outputs 238a and 238b coupled by output resistor 236 and output capacitor 237.

Continuing to FIG. 2B, FIG. 2B illustrates circuit arrangement 230B corresponding to variable gain control TIA 230A, in FIG. 2A, according to one embodiment of the present invention. As shown in FIG. 2B, circuit arrangement 230B may be implemented using a folded cascode circuit topology, thereby enabling use of a low voltage power supply, such as an approximately 1.2V supply, for example, to power the variable gain control TIA corresponding to circuit arrangement 230B.

Circuit arrangement 230B includes input devices 242a and 242b coupled to respective differential inputs 231a and 231b, and coupled to ground through respective input resistors 233a and 233b. As also shown in FIG. 2B, circuit arrangement 230B includes input cascode devices 244a and 244b, folded cascode grouping 250 including cascode output devices 252a and 252b coupled to output resistor 236 and output capacitor 237, devices 246a and 246b coupled to supply voltage $V_{DD}$, and devices 248a and 248b coupled to ground. According to one embodiment, as shown for example in FIG. 2B, input devices 242a and 242b and input cascode devices 244a and 244b may be n-channel field-effect transistors (NFETs), and devices 248a and 248b may comprise NFETs sharing a common gate contact. In addition, according to the embodiment of FIG. 2B, devices 246a and 246b and output cascode devices 252a and 252b may comprise PFETs sharing common gate contacts. It is noted that the directional arrows shown in FIG. 2B are provided to indicate the direction of current flow in circuit arrangement 230B.

Referring now to FIG. 2C, FIG. 2C shows a more detailed example of folded cascode grouping 250 illustrating exemplary cross-coupling of output cascode devices, e.g., output cascode PFETs 252a and 252b, to provide gain control, according to one embodiment of the present invention. As shown in FIG. 2C, in addition to output cascode devices 252a and 252b, folded cascode grouping 250 includes cross-coupling devices 254a and 254b, also shown as PFETs in that figure, configured to couple opposite power terminals of output cascode devices 252a and 252b. For example, cross-coupling device 254a is shown to couple the drain of PFET 252a to the source of PFET 252b, while cross-coupling device 254b couples the source of PFET 252a to the drain of PFET 252b.

As a result of the arrangement shown in FIG. 2C, current can flow from the to power terminals of output cascode device 252a to the opposite power terminals of output cascode device 252b under the control of cross-coupling devices 254a and 254b, thereby controllably adjusting $V_{OUT}$. Thus, one or both of cross-coupling devices 254a and 254b can be selectively activated so as to contribute to the gain control provided by variable gain control TIA 230A. Although the present figures show the cross-coupling scheme of FIG. 2C applied to output cascode devices 252a and 252b, in other embodiments a similar approach may be adopted using input cascode devices 244a and 244b, either in addition to, or in lieu of, cross-coupling of output cascode devices 252a and 252b. The approach to implementing gain control illustrated in FIGS. 2A, 2B, and 2C can provide a gain control range of greater than 30 dB, such as a gain control range of 50 dB, and provide accurate gain control steps of less than approximately 1 dB each, for example.

Moving on to FIG. 3, FIG. 3 is a block diagram of digitally controlled interface circuit 360 suitable for implementation in a shared functionality circuit combination represented by circuit combination 316, according to one embodiment of the present invention. Shared functionality circuit combination 316 including variable gain control TIA 330, digitally controlled interface circuit 360, and 2nd-order adjustable LPF 370 corresponds to either or both of shared functionality circuit combinations 116a and 116b including respective variable gain control TIAs 130a and 130b, digitally controlled interface circuits 160a and 160b, and $2^{nd}$-order adjustable LPFs 170a and 170b, in FIG. 1. Also shown in FIG. 3 are ADC 318 and interface control unit 372, corresponding respectively to ADCs 118a and 118b and interface control units 172a and 172b, in FIG. 1.

As previously mentioned, variable gain control TIA 330 and 2nd-order adjustable LPF 370 are typically implemented as analog circuits. Consequently, despite their specific representation in the embodiment of FIG. 3, more generally, variable gain control TIA 330 and 2nd-order adjustable LPF 370 may correspond to any two analog circuits connected by digitally controlled interface circuit 360. As shown in FIG. 3, digitally controlled interface circuit 360 receives control data from ADC 318, e.g., digital control data, via interface control unit 372. It is again noted that although interface control unit 372 is shown as a discrete circuit element, in other embodiments interface control unit 372 may be incorporated into digitally controlled interface circuit 360, or into ADC 318, for example.

As shown in FIG. 3, adjustable current mode buffer 332 provides differential outputs 338a and 338b of variable gain control TIA 330, corresponding respectively to differential outputs 238a and 238b, in FIG. 2A. As further shown by FIG. 3, 2nd-order adjustable LPF 370 includes differential inputs 371a and 371b. Differential outputs 338a and 338b are characterized by voltage $V_{OUT}$, which can be understood to include contributions from a first direct-current (DC) offset and a first common mode voltage at differential outputs 338a and 338b. Analogously, differential inputs 371a and 371b are characterized by voltage $V_{IN}$, which can be understood to include contributions from a second DC offset and a second common mode voltage at differential inputs 371a and 371b. Digitally controlled interface circuit 360 is configured not only to connect differential outputs 338a and 338b to respective differential inputs 371a and 371b, but to match their respective first and second DC offsets and common mode voltages as well, thereby facilitating the shared functionality of circuit combination 316.

According to the embodiment of FIG. 3, digitally controlled interface circuit 360 includes current blocks 361a and 361b configured to generate currents "$i_a$" and "$i_b$" flowing through respective resistors 365a and 365b. Currents $i_a$ and $i_b$ can be tuned using the adjustable current sources internal to respective current blocks 361a and 361b. For example, current $i_a$ can be tuned using adjustable current sources 362a, 364a, 366a, and 368a, while tuning of current $i_b$ can be performed using adjustable current sources 362b, 364b, 366b, and 368b. In one embodiment, the adjustable current sources internal to current blocks 361a and 361b may comprise cross-coupled pairs (cross-coupling not explicitly shown in FIG. 3). For example, adjustable current sources 362a and 368a may be cross-coupled so as to be concurrently adjusted by the same trimming code. Similarly, adjustable current sources 364a and 366a, 362b and 368b, and 361b and 366b may each compose a cross-coupled adjustable current source pair.

As may be understood from an examination of FIG. 3:

$$V_{OUT}=V_{IN}+R(i_a-i_b);$$ (Equation 1)

where R is the resistance value of nominally identical resistors 365a and 365b.

Moreover:

$$V_{OUT\,COMMON\,MODE}=R[(i_a+i_b)/2]+V_{IN\,COMMON\,MODE};$$ (Equation 2)

According to Equations 1 and 2, the first DC offset and first common mode voltage at differential outputs 338a and 338b can be matched to the second DC offset and second common mode voltage at inputs 371a and 371b through the selection of appropriate trimming codes for the adjustable current sources contained by each of current blocks 361a and 361b. Those trimming codes, e.g., digital trimming codes, can be generated by interface control unit 372, according to data provided by ADC 318, for example.

According to the specific embodiment shown in FIG. 3, the shared functionality of circuit combination 316 may correspond to implementation of a higher order receive signal filtering than can be provided by 2nd-order adjustable LPF 370 alone. For example, $2^{nd}$-order LPF 370 represents a two-pole adjustable LPF. However, an effective three-pole adjustable LPF can be generated by the synergy produced by shared functionality circuit combination 316. In other words, variable gain control TIA 330 can be configured to supply one pole of three-pole LPF, while 2nd-order adjustable LPF 370 can supply an additional two poles, resulting in shared functionality circuit combination 316 effectively implementing a three-pole adjustable LPF. Moreover, that shared functionality is facilitated by digitally controlled interface circuit 360, which may be used to connect variable gain control TIA 330 and $2^{nd}$-order adjustable LPF 370, and to provided DC offset and common mode voltage matching for variable gain control TIA 330 and $2^{nd}$-order adjustable LPF 370. In one embodiment, for example, shared functionality circuit combination 316 may implement a three-pole adjustable low-pass Chebyshev filter.

Continuing to FIG. 4A, FIG. 4A is a block diagram of $2^{nd}$-order adjustable LPF 470 suitable for use in a circuit combination having a shared functionality, according to one embodiment of the present invention. Second-order adjustable LPF 470 having differential inputs 471a and 471b corresponds to $2^{nd}$-order adjustable LPF 370 having differential inputs 371a and 371b, in FIG. 3. It is noted that although the present embodiment represents a specific implementation of a $2^{nd}$-order adjustable LPF, the present inventive principles can be applied more generally to other types of adjustable filters, such as $3^{rd}$-order or higher adjustable LPFs, or adjustable high-pass, band-pass, or notch filters, for example.

As shown in FIG. 4A, according to the present embodiment, $2^{nd}$-order adjustable LPF 470 includes variable resistance input block 480a coupled to differential inputs 471a and 471b. In addition, $2^{nd}$-order adjustable LPF 470 comprises operational amplifiers (op-amps) 474a and 474b, variable resistance transition block 480b, fixed resistors 472a and 472b, variable capacitors 490a, 490b, 490c, and 490d (hereinafter "variable capacitors 490a-490d"), and variable resistors 480c and 480d.

As further shown in FIG. 4A, each input to op-amps 474 and 476 is coupled to a corresponding op-amp output by a respective one of variable capacitors 490a-490d. Gain control for $2^{nd}$-order adjustable LPF 470 can be provided through adjustment of variable resistance input block 480a, for example, while the pole and frequency characteristics of $2^{nd}$-order adjustable LPF 470 can be tuned using variable resistors 480c and 480d, and to variable capacitors 490a-490d, for example. Thus, in one embodiment $2^{nd}$-order adjustable LPF 470 may be implemented in a multi-mode RF receiver to concurrently support communications in a second-generation wireless telephone technology (2G) mode, as well as in a 3G mode, for example, through scaling of variable capacitors 490a-490d and tuning of the variable resistances internal to $2^{nd}$-order adjustable LPF 470.

Moreover, by cross-coupling the outputs of op-amp 474 to the inputs of op-amp 476 through variable resistance transition block 480b, the present inventive concepts enable reduction of the number of op-amps required for filter implementation, when compared with conventional designs. For example, a conventional two-pole bi-quad filter design requires three op-amps for its implementation, while the present embodiment provides a two-pole adjustable LPF using no more than two op-amps, e.g., op-amps 474 and 476. In other words, FIG. 4A discloses a design in which the number of op-amps required for filter implementation does not exceed the number of poles characterizing the filter.

Referring to FIG. 4B, FIG. 4B is a block diagram of a variable resistance block implemented in $2^{nd}$-order adjustable LPF 470 of FIG. 4A, according to one embodiment of the present invention. Variable resistance block 480 can correspond to either or both of variable resistance input block 480a and variable resistance transition block 480b. In addition, in one embodiment, variable resistors 480c and 480d can be implemented in combination according to the arrangement shown in FIG. 4B.

As shown in FIG. 4B, variable resistance block 480 comprises network 486 of switchable unit resistors arranged in series, and parallel array 482 of switchable resistors situated between differential inputs 481a and 481b of variable resistance block 480 and series resistance network 486. For example, where variable resistance block 480 corresponds to variable resistance input block 480a, parallel array 482 is situated between differential inputs 471a and 471b of $2^{nd}$ order adjustable LPF 470 and series resistance network 486. In that particular implementation, adjustment of the resistance provided by series resistance network 486 may be performed to provide gain control, while adjustment of the resistance provided by parallel array 482 can be performed to assure constant input impedance to variable resistance block 480.

According to the embodiment of FIG. 4B, parallel array 482 comprises a number "$n_1$" of resistive branches 484, each coupled in parallel to all others, and each controlled by a respective switch 483. As may be understood from the embodiment of FIG. 4B, selective activation or deactivation of one or more of switches 483 serves to vary the resistance of parallel array 482. As further shown in FIG. 4B, series resistance network 486 of variable resistance block 480 comprises unit resistors $487a_1$, $487a_2$, . . . , $487a_{n2}$ (hereinafter "unit resistors $487a_1$-$487a_{n2}$") which can be switched in or out of series resistance network 486 by respective switches $485a_1$, $485a_2$, . . . , $485a_{n2}$ (hereinafter "switches $485a_1$-$485a_{n2}$"). In addition, series resistance network 486 also comprises unit resistors $487b_1$, $487b_2$, . . . , $487b_{n2}$ (hereinafter "unit resistors $487b_1$-$487b_{n2}$") which can be switched in or out of series resistance network 486 by respective switches $485b_1$, $485b_2$, . . . , $485b_{n2}$ (hereinafter "switches $485b_1$-$485b_{n2}$"). In one embodiment, for example, switches 483, $485a_1$-$485a_{n2}$, and $485b_1$-$485b_{n2}$ can comprise native devices, thereby resulting in a reduced "ON" resistance.

Continuing to FIG. 4C, FIG. 4C is a block diagram of variable capacitor 490 implemented in the $2^{nd}$-order adjustable LPF of FIG. 4A, according to one embodiment of the present invention. Variable capacitor 490 correspond to any or all of variable capacitors 490a-490d, in FIG. 4A. As shown in FIG. 4C, variable capacitor 490 comprises network 492 of switchable unit capacitors arranged in parallel. For example, according to the embodiment of FIG. 4C, network 492 comprises a number "n" of switched unit capacitor branches 494, each including a unit capacitor 496a, 496b, . . . , 496n (hereinafter "unit capacitors 496a-496n") and a respective switch 498a, 498b, . . . , 498n (hereinafter "switches 498a-498n") for switching respective unit capacitors 496a-496n into and out of the collective capacitance produced by network 492. Implementation of the embodiments shown in FIGS. 4B and 4C in the embodiment of FIG. 4A, for example, can enable tuning of $2^{nd}$-order adjustable LPF 470 to advantageously ensure that the RC of the filter remains substantially constant over process-voltage-temperature (PVT) variations.

Thus, by providing a digitally controlled interface circuit to connect two analog circuits and to concurrently perform DC offset and common mode voltage matching, embodiments of the present invention enable circuit combinations exhibiting shared functionality. For example, embodiments of the present invention interface a variable gain control TIA and a $2^{nd}$-order adjustable LPF to produce an effective three-pole adjustable LPF suitable for use in a compact low-power RF receiver or transceiver. Moreover, by implementing variable capacitors and variable resistors using respective networks of switchable unit capacitors and unit resistors, embodiments of the present invention enable a highly tunable LPF capable of maintaining a substantially constant RC over PVT variations.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A compact low-power receiver comprising:
   first and second analog circuits, said first analog circuit having a first direct-current (DC) offset and a first common mode voltage at an output, said second analog circuit having a second DC offset and a second common mode voltage at an input; and
   a digitally controlled interface circuit connecting said output to said input;
   said digitally controlled interface circuit configured to match said first and second DC offsets and to match said first and second common mode voltages.

2. The compact low-power receiver of claim 1, further comprising an analog-to-digital converter (ADC) coupled to an output of said second analog circuit, said ADC configured to provide control data for said digitally controlled interface circuit.

3. The compact low-power receiver of claim 1, wherein said digitally controlled interface circuit comprises a plurality of cross-coupled adjustable current source pairs for tuning at least one internal current of said digitally controlled interface circuit so as to match said first and second DC offsets and said first and second common mode voltages.

4. The compact low-power receiver of claim 1, wherein said first analog circuit comprises a variable gain control transimpedance amplifier implemented using a current mode buffer.

5. The compact low-power receiver of claim 1, wherein said second analog circuit comprises a two-pole adjustable low-pass filter.

6. The compact low-power receiver of claim 1, wherein said first and second analog circuits together function as a three-pole low-pass Chebyshev filter.

7. A receiver comprising:
   first and second analog circuits, said first analog circuit having a first direct-current (DC) offset and a first common mode voltage at an output, said second analog circuit having a second DC offset and a second common mode voltage at an input;
   a digitally controlled interface circuit connecting said output to said input;
   said digitally controlled interface circuit configured to match said first and second DC offsets.

8. The receiver of claim 7, further comprising an analog-to-digital converter (ADC) coupled to an output of said second analog circuit, said ADC configured to provide control data for said digitally controlled interface circuit.

9. The receiver of claim 7, wherein said digitally controlled interface circuit comprises a plurality of cross-coupled adjustable current source pairs.

10. The receiver of claim 7, wherein said first analog circuit comprises a variable gain control transimpedance amplifier implemented using a current mode buffer.

11. The receiver of claim 7, wherein said second analog circuit comprises a two-pole adjustable low-pass filter.

12. The receiver of claim 7, wherein said first and second analog circuits together function as a three-pole low-pass Chebyshev filter.

13. A receiver comprising:
   first and second analog circuits, said first analog circuit having a first direct-current (DC) offset and a first common mode voltage at an output, said second analog circuit having a second DC offset and a second common mode voltage at an input;
   a digitally controlled interface circuit connecting said output to said input;
   said digitally controlled interface circuit configured to match said first and second common mode voltages.

14. The receiver of claim 13, further comprising an analog-to-digital converter (ADC) coupled to an output of said second analog circuit, said ADC configured to provide control data for said digitally controlled interface circuit.

15. The receiver of claim 13, wherein said digitally controlled interface circuit comprises a plurality of cross-coupled adjustable current source pairs.

16. The receiver of claim 13, wherein said first analog circuit comprises a variable gain control transimpedance amplifier implemented using a current mode buffer.

17. The receiver of claim 13, wherein said second analog circuit comprises a two-pole adjustable low-pass filter.

18. The receiver of claim 13, wherein said first and second analog circuits together function as a three-pole low-pass Chebyshev filter.

* * * * *